(12) United States Patent
Loinaz

(10) Patent No.: US 12,166,570 B2
(45) Date of Patent: *Dec. 10, 2024

(54) HIGH PRECISION MULTI-CHIP CLOCK SYNCHRONIZATION

(71) Applicant: Anacapa Semiconductor, Inc., Los Altos, CA (US)

(72) Inventor: Marc Loinaz, Los Altos Hills, CA (US)

(73) Assignee: Anacapa Semiconductor, Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/138,844

(22) Filed: Dec. 30, 2020

(65) Prior Publication Data

US 2021/0152269 A1   May 20, 2021

Related U.S. Application Data

(63) Continuation of application No. 16/265,322, filed on Feb. 1, 2019, now Pat. No. 10,911,171.

(51) Int. Cl.
| | |
|---|---|
| *H04J 3/06* | (2006.01) |
| *G06F 1/12* | (2006.01) |
| *H03K 5/133* | (2014.01) |
| *H03K 5/135* | (2006.01) |
| *H04L 7/00* | (2006.01) |
| *H04L 12/40* | (2006.01) |
| *H04Q 9/00* | (2006.01) |

(52) U.S. Cl.
CPC ............ *H04J 3/0667* (2013.01); *H03K 5/133* (2013.01); *H03K 5/135* (2013.01); *H04J 3/0682* (2013.01); *H04L 7/0037* (2013.01)

(58) Field of Classification Search
CPC ...... H04J 3/0667; H04J 3/0682; H03K 5/133; H03K 5/135; H04L 7/0037
See application file for complete search history.

(56) References Cited

U.S. PATENT DOCUMENTS

| | | | | |
|---|---|---|---|---|
| 8,325,704 B1 * | 12/2012 | Lemkin | ................ | H04J 3/0667 370/347 |
| 11,619,719 B2 * | 4/2023 | Loinaz | ................ | G01S 7/4817 356/5.01 |
| 2014/0119080 A1 * | 5/2014 | Sakamoto | ............ | H02M 7/493 363/95 |

(Continued)

*Primary Examiner* — Xuan Lu
(74) *Attorney, Agent, or Firm* — Law Office of John Stattler

(57) ABSTRACT

A sensor network, which includes a sensor controller serially coupled to a plurality of sensor modules, is configured to program the sensor modules so as to transfer measurement data to the sensor controller and to synchronize the sensor modules to picosecond accuracy via on-chip or on-module custom circuits and a physical layer protocol. The sensor network has applications for use in PET, LiDAR or FLIM applications. Synchronization, within picosecond accuracy, is achieved through use of a picosecond time digitization circuit. Specifically, the picosecond time digitization circuit is used to measure on-chip delays with high accuracy and precision. The delay measurements are directly comparable between separate chips even with voltage and temperature variations between chips.

14 Claims, 5 Drawing Sheets

(56) References Cited

U.S. PATENT DOCUMENTS

| | | | |
|---|---|---|---|
| 2014/0247839 A1* | 9/2014 | Kingsley | H04L 43/12 |
| | | | 370/503 |
| 2015/0092797 A1* | 4/2015 | Aweya | H04J 3/0667 |
| | | | 370/516 |
| 2017/0099131 A1* | 4/2017 | Bosch | H04L 7/0016 |
| 2019/0297553 A1* | 9/2019 | Wang | H04W 36/32 |
| 2020/0205026 A1* | 6/2020 | Li | H04W 28/10 |

* cited by examiner

HIGH PRECISION MULTI-CHIP CLOCK SYNCHRONIZATION

RELATED APPLICATIONS

This application is a continuation of U.S. patent application Ser. No. 16/265,322, entitled "HIGH PRECISION MULTI-CHIP CLOCK SYNCHRONIZATION", inventor Marc Loinaz, filed Feb. 1, 2019, which claims priority, under 35 U.S.C. § 119(e), to U.S. Provisional Application No. 62/625,295, entitled "HIGH PRECISION MULTI-CHIP CLOCK SYNCHRONIZATION", inventor Marc Loinaz, filed Feb. 1, 2018, both of which are expressly incorporated herein by reference.

BACKGROUND

Precision time delay measurement is a requirement for emerging sensor applications. In Positron Emission Tomography (PET) and Light Detection and Ranging (LiDAR), precise measurement of photon time-of-flight (ToF) allows precise quantification of the spatial location of an event. In Fluorescence Lifetime Imaging (FLIM) photon arrival times at a sensor are used to detect the presence of fluorophore-tagged molecules within a biological sample.

In PET, the event of interest is the annihilation of a positron (from a radioactive dye) and an electron within a chemically active region within the body of a medical patient or live laboratory subject. The event produces two gamma ray photons that are travelling in opposite directions. The ToF measurements to a three-dimensional sensor array in a PET scanner allow precise location of the event, which could, for example, indicate the presence of a tumor.

In LiDAR, the event of interest is scattering of photons from a laser pulse. The ToF of laser photons from when they are emitted by the laser, scattered from a target object and then detected in a sensor allows the distance of the target object from the LiDAR system to be precisely resolved. This has applications in Unmanned Autonomous Vehicles (UAVs) and Advanced Driver Assistance Systems (ADAS).

In Fluorescence Lifetime Imaging (FLIM), the event of interest is the generation of fluorescence photons by a laser pulse. The photon arrival times relative to the laser pulse are used to build a histogram of the fluorescence decay transient of a laser-excited molecule. The measurement of the decay time allows detection of fluorophore-tagged molecules within a tissue sample. Additionally, the use of FLIM allows detection of Förster Resonance Energy Transfer (FRET), which allows the measurement of the distance between specific molecules within a cell.

In all of these applications there is a need for more sensors so as to improve system sensitivity (by increasing the number of photons captured) and accuracy as well as to increase measurement throughput. This requires large numbers of sensor chips and sensor modules distributed in arbitrary physical configurations. Furthermore, these sensor systems need to be synchronized to accuracies of picoseconds. To highlight the required timing accuracies, measurement of ToF to within 3.3 ps allows spatial resolution of 1 mm. Current distributed timing synchronization methods do not allow picosecond time measurement accuracy or are difficult to implement and require extensive calibration.

In current sensor systems, time synchronization involves a passive approach as shown in FIG. 1. Clock buffers 115 receive a reference clock, from reference clock generator (112).

The clock buffers 115 drive the transmission lines (120), with matched lengths, for input to the sensor chips (sensor chip 1 (125), sensor chip 2 (130) and sensor chip three (135)). The sensor chips (125, 130 and 135) are controlled through a master reset 140. Since the trace lengths and transmission lines from the reference oscillator all the way to sensor chips 1 (125), 2 (130) and 3 (135) are matched and the clock buffers (115) are assumed to be identical then there will be minimal time skew between the clock signals seen at each chip. In addition, the master reset signal (140) is distributed to the sensor chips (125, 130 and 135) using matched-length transmission lines (120). This allows the state of each chip (including the states of on-chip clock dividers) to be simultaneously initialized so as to be identical across chips.

There are many practical problems with the passive synchronization approach. The clock buffers, while they are nominally identical, may have mismatch due to manufacturing variations. Adding another sensor chip to the system is difficult since it requires redesign of the reference clock distribution circuit to a) add another clock buffer and b) add another clock transmission line that is matched to the others. If there is a mismatch between the temperatures or power supply voltages seen by the sensor chips then there will be mismatches in the on-chip gate delays seen on the chips, which will tend to de-synchronize the chips. The master reset is also problematic since each sensor chip could have some random mismatch. As a result the chips may not be reliably reset to the same state. Therefore, an active synchronization strategy is required that adjusts for 1) slight trace mismatch and chip-to-chip mismatch; 2) voltage and temperature variations between chips; and 3) the possibility of reset state mismatch between chips. Therefore, better solutions for time synchronization are required to meet timing that demand accuracies within picoseconds.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Today, there exists networking protocols that allow for the time synchronization of local area network (LAN) elements such as routers, switches and network interface cards within computers, test instrumentation or factory machines. Precision Time Protocol (PTP) is designed to be compatible with Ethernet, the dominant LAN technology in use today. PTP is designed for sub-microsecond time accuracy. White Rabbit (WR) is based on PTP and Synchronous Ethernet and is designed for sub-nanosecond accuracy. White Rabbit was designed for the instrument synchronization, control and data transfers required for large-scale particle physics experiments (e.g. the LHC experiment at CERN).

Both PTP and WR involve the use of network elements that have time stamping capability. The time at which an Ethernet frame is sent or received can be recorded by all compliant network elements. A master-slave hierarchy is specified that allows the master network elements to update the current time at the slave elements. Because master and slave are connected via an electrical cable or fiber optic cable there will be a time delay (or latency) in communication between them. The protocol gives masters the ability to estimate the time delay with which they communicate with their slaves. This allows the masters to pass their local time to the slaves along with the delay information. The slaves then update their local time to the master's time plus the master-to-slave message delay. The result is that the master and slave time readings are nominally identical.

PTP and WR do not give sufficient time synchronization for the aforementioned PET, LiDAR and FLIM applications where time measurement accuracies of picosecond to tens of picoseconds are required. WR has been shown to achieve hundreds of picoseconds of timing accuracy. It involves a coarse time stamping technology with complex sequence of message passing between master and slave that allows the slave to shift its internal clock in fine phase steps so as to achieve synchronization. WR is designed so as to minimize the need for custom integrated circuits designed specifically for the synchronization process.

To achieve accuracy in the range 1-100 ps, custom integrated circuits are required to measure time stamps with sub-100 ps accuracy. These circuits must be combined with a physical layer protocol for measuring the latency in the connections between network elements.

Figure 1:
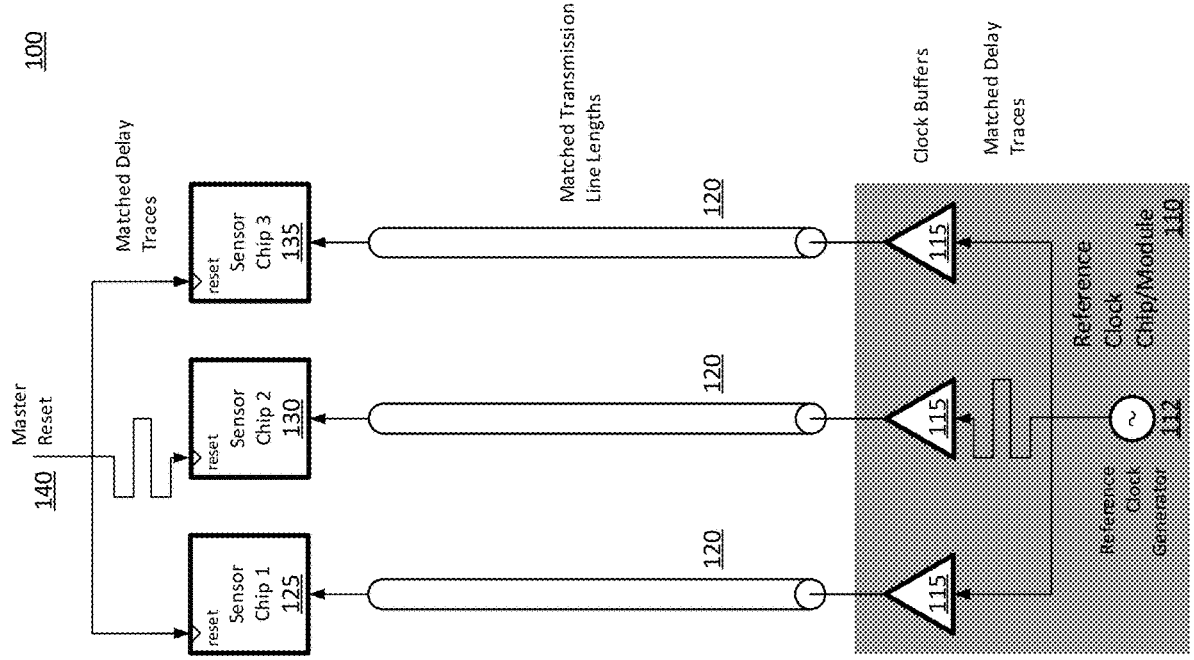
FIG. 1 illustrates a passive approach for time synchronization used in current sensor systems.
Figure 2:
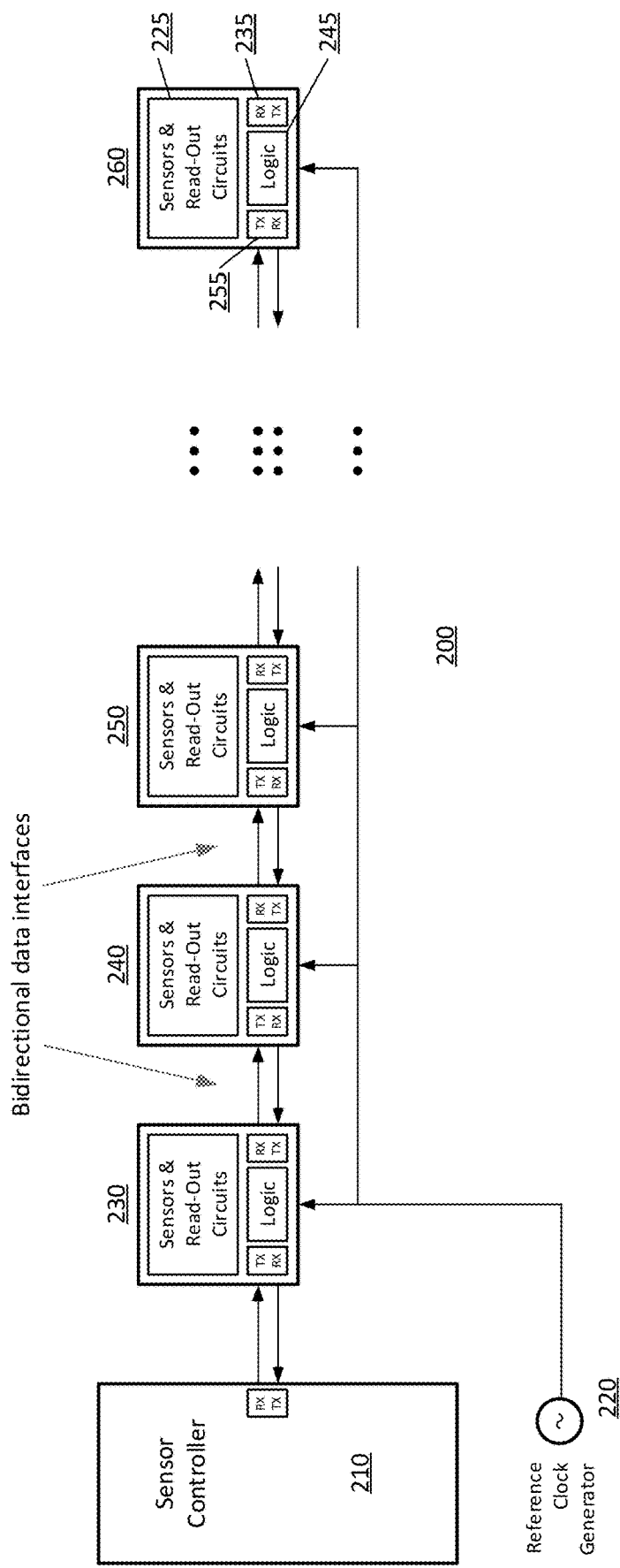
FIG. 2 illustrates one embodiment for a sensor network, including a sensor network for use in PET, LiDAR or FLIM applications.

FIG. 2 illustrates one embodiment for a sensor network, including a sensor network for use in PET, LiDAR or FLIM applications. The sensor network 200 includes a sensor controller (210) serially coupled to a plurality of sensor modules (230, 240, 250 and 260). Each sensor module includes, as shown by example in sensor module 260, sensor and readout circuits (225), logic circuits (245) as well as transceiver circuits (235 and 255). The sensor modules (230, 240, 250 and 260) receive a timing reference from reference clock generator (220). Each sensor module (230, 240, 250 and 260) may be a single chip or a module made out of multiple chips. The network elements (sensor controller (210) and sensor modules (230, 240, 250 and 260) are daisy-chained. This allows straightforward expandability for each chain. The sensor controller (210) may also be designed to service multiple daisy chains. Note that the reference clock (220) is distributed to each network element without any timing skew requirements.

The sensor network (200) allow the sensor controller (210) to a) configure and program the sensor modules (230, 240, 250 and 260), b) the sensor modules (230, 240, 250 and 260) to transfer measurement data to the sensor controller (210), and c) synchronize all the sensor modules (230, 240, 250 and 260) to picosecond accuracy via on-chip or on-module custom circuits and a physical layer protocol.

Figure 3:
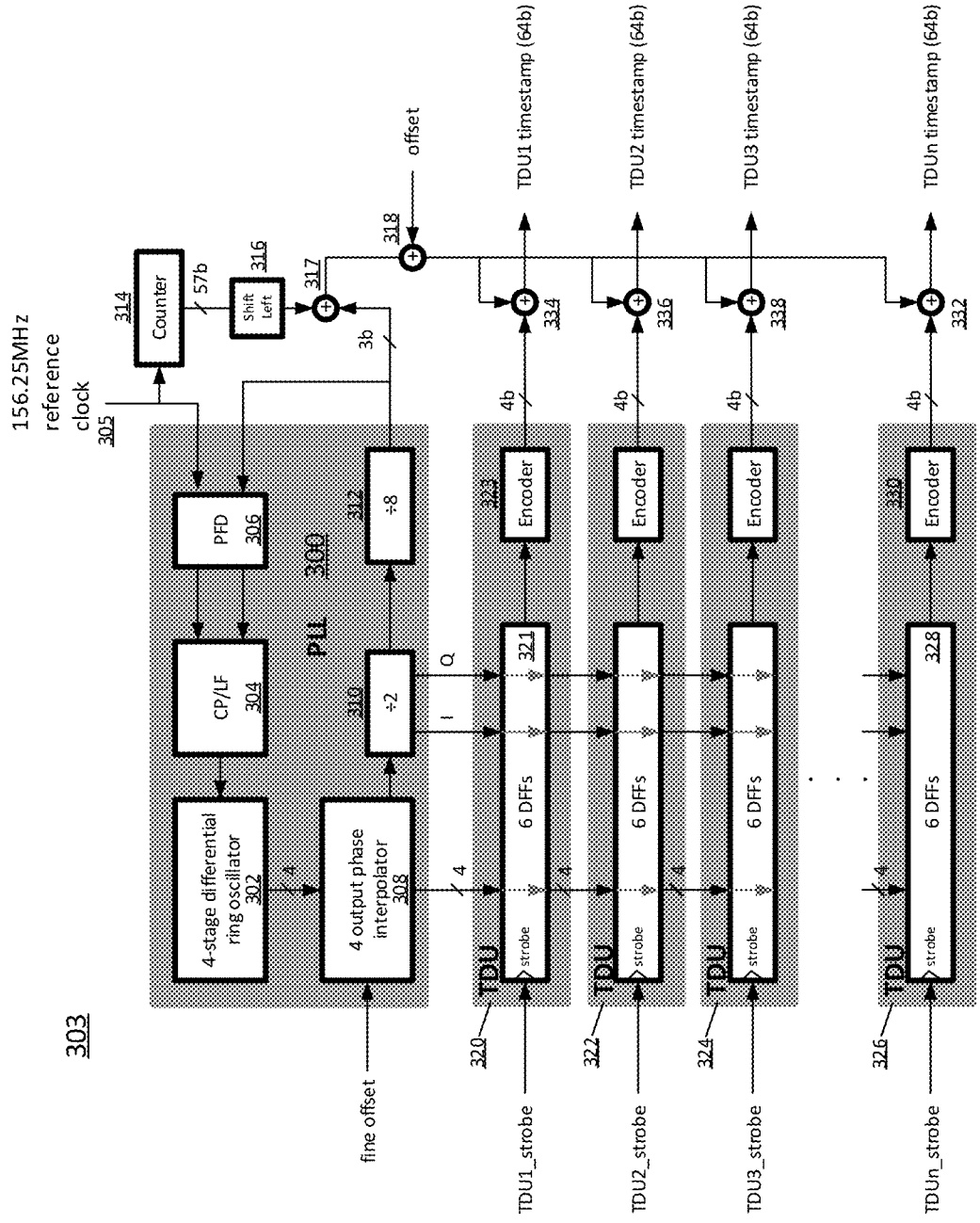
FIG. 3 illustrates one embodiment for a picosecond time digitization circuit.

FIG. 3 illustrates one embodiment for a picosecond time digitization circuit. Circuit 303 may be used to measure on-chip delays with high accuracy and precision. The delay measurements are directly comparable between separate chips even with voltage and temperature variations between chips because the time delay measurement unit is fixed using an on-chip Phase-Locked Loop (PLL).

A PLL (300) consists of a 4-stage ring oscillator (implemented using differential circuits) (302), a phase interpolator (308), divider circuits (310 and 312), a phase-frequency detector (PFD) (306), a charge pump (CP) and loop filter (LF) (304) is phase-locked to the system reference clock (305). With the reference clock (305) at 156.25 MHz and the dividers (310 and 312), as shown in FIG. 3, the VCO (302) will oscillate at 2.5 GHz, and each ring oscillator gate delay will be 50 ps over expected chip supply voltage and temperature variations. This 50 ps unit gate delay forms the least significant bit (LSB) of the time stamping circuit. The 4 ring oscillator stage (302) outputs and the two (in-phase and quadrature) outputs of the divide-by-2 circuit (310) are distributed to each Time Digitization Unit (TDU) (320, 322, 324 and 326). In some embodiments, each TDU (320, 322, 324 and 326) consists of 6 flip-flops and an encoder, such as flip-flops 321 and encoder 323 in TDU 320, that produces a binary representation of the time measurement. The binary output of the encoder for TDUs (320, 322, 324 and 326) represents the occurrence time of the TDU strobe rising edge within the 800-ps clock period of the signal at the input to the divide-by-8 block (312). The three bits of the divide-by-8 binary counter (312) are added to the outputs of a counter clocked by the reference clock (305). This sum is added to the output of each TDU (320, 322, 324 and 326) so as to produce a 64-b representation of the time on the chip. Note that a 64b representation allows time to be recorded with 50 ps precision over a period of 29 years for the circuit in before the time count rolls over.

Note that each TDU (320, 322, 324 and 326) samples the in-phase and quadrature outputs of the divide-by-2 circuit (310). This allows the correct divider state to be sampled while correcting for non-zero divider delay. The correct divider output is chosen based on the sampled state of the ring oscillator stage that clocks the divider.

The time stamping circuit further includes counter 314, shift left 316, summing circuits (317, 318, 334, 336, 338 and 332). These circuits (314, 316, 317, 318, 334, 336, 338 and 332) allow a global time offset to be injected into the 64-b time representation so as to correct the local chip time relative to a master time with a precision of one TDU LSB. The phase interpolator (308) allows the 4 VCO (302) output signals to be shifted together in sub-LSB steps. This allows for fine time control that would allow chip-to-chip synchronization to less than one LSB.

An arbitrary number of TDUs can be used on a chip. However, it is important that the propagation delays of the 6 clock signals from the PLL be the same for all TDUs. This can be achieved by trace matching and repeater delay matching methods that are part of the known art in custom integrated circuit design.

Note that the LSB precision of the time stamping circuit can be improved by running the ring oscillator (302) faster (by dissipating additional power) or by implementing the circuit (303) in a more advanced process technology. In addition, interpolation between ring oscillator (302) stages can be used to reduce the LSB size further. An LSB of <10 ps should be readily achievable with commercially-available 16 nm finFET CMOS processes.

Synchronization is performed via a master-slave algorithm where, for two chips next to each other on the daisy chain, the chip electrically closer to the controller is the master and the chip farther from the controller is the slave. The master causes the slave to update its internal time to match that of the master.

The sensor network (200, FIG. 2) may be designed to use on Ethernet-like protocol to pass data between master and slave. In this case, data frames would be transmitted between chips with the frames interspersed with idle characters. It is during the idle periods that synchronization steps may be performed. Alternatively, regularly scheduled synchronization periods could be defined. While synchronization could be done at system start-up, it is important that synchronization occurs regularly even after system start-up in order for the system to correct for temperature and power supply voltage changes that occur after start-up.

Figure 4:
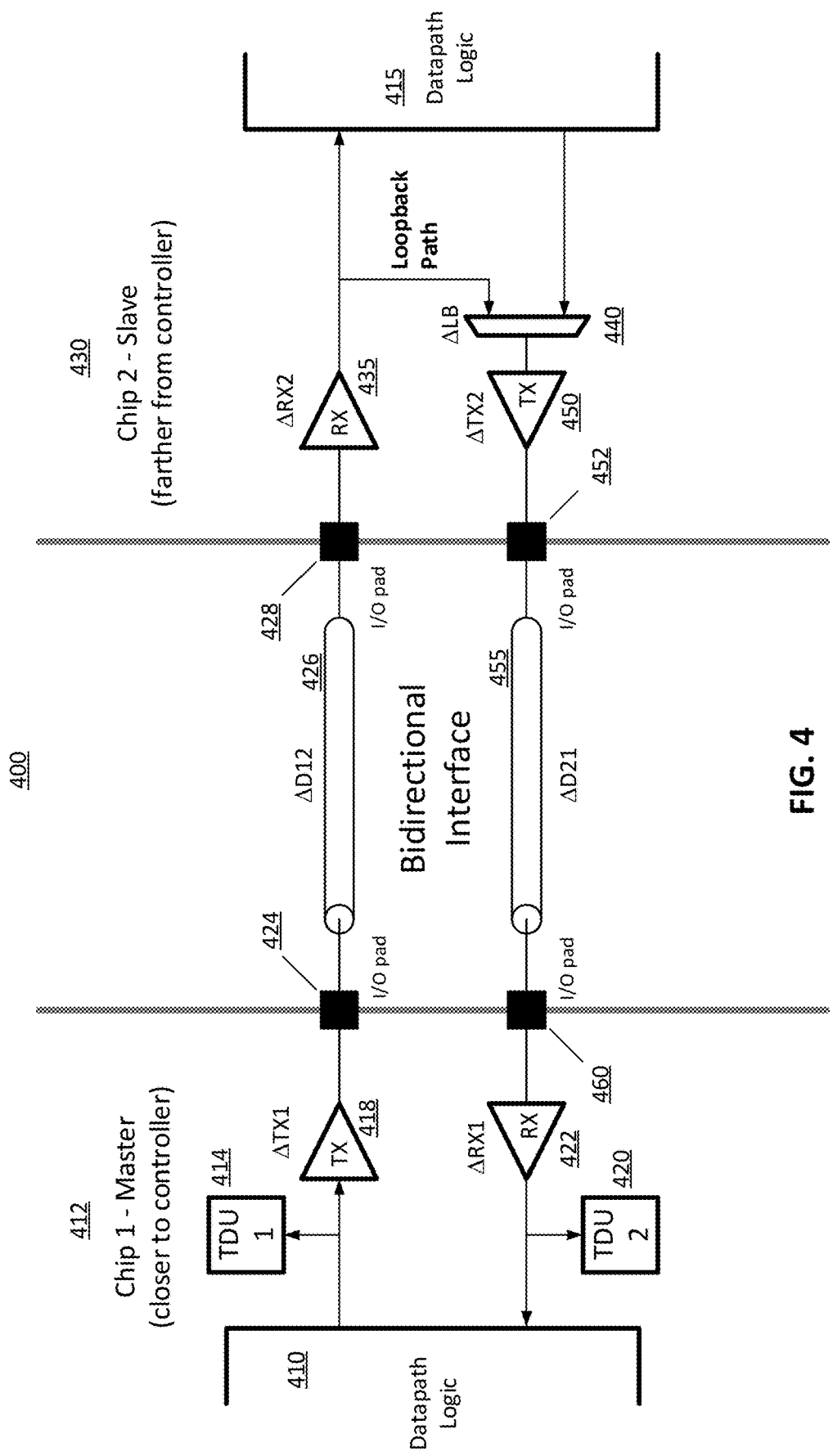
FIG. 4 illustrates embodiments for time synchronization across master and slave devices.

FIG. 4 illustrates one embodiment for synchronization between a master IC (412) and a slave IC (430). For this embodiment, the master IC (412) and slave IC (430) include datapath logic (410 and 415), TDUs (414 and 420), and transceiver circuits (418, 422) and (435, 440 and 450). Synchronization occurs with the slave placed in a loopback mode where data received from the master is immediately transmitted by the slave back to the master over bidirectional interface (426 and 455), as shown in FIG. 4.

The master can measure the round drip delay using its on-chip TDUs (414 and 420). The round trip delay can be expressed as:

$$T_{round} = DTX1 + DD12 + DRX2 + DLB + DTX2 + DD21 + DRX1$$

DTX1 represents the delay through the transmitter (418) (which may include the serializer) on master IC (412). DRX1 represents the delay through the receiver (435) (which may include the deserializer). DTX2 and DRX2 represent transmitter (450) and receiver (435) delays on slave IC (430). DLB represents the delay through the loopback path (440) on slave IC (430). DD12 represents the propagation delay in the interconnect (426) carrying data from master IC 412 to slave IC 430. DD21 represents the propagation delay in the interconnect (455) carrying data from slave IC 430 to master IC (412). Note that the interconnects (426 and 455) may be a printed circuit board traces, electrical cables, or fiber optic cables.

The desired quantity is the latency from master to slave:

$$T_{latency} = DTX1 + DD12 + DRX2$$

Once $T_{latency}$ is known by the master IC (412), then it can send its own internal time reading to the slave IC (430) along with the value of $T_{latency}$. The slave IC (430) then updates its internal time to master's time plus the $T_{latency}$. If the link is completely symmetrical and DLB is zero then the latency could be determined by simply halving the $T_{round}$ measurement value. In practice this is unrealistic because of implementation details associated with the serializer/deserializer (SerDes) circuits used to realize modern high-speed data networks. The delay through a SerDes TX and RX can vary by multiple bit intervals with the initialization state of the serializer and deserializer subcircuits. Such circuits always include dividers, which will initialize in non-deterministic states. Therefore the delay through a serializer or deserializer is not known unless it is specifically reset. In addition, because of chip-to-chip power supply and temperature variations, there is no guarantee that DTX1 will be the same as DTX2 and that DRX1 will be the same as DRX2. Finally, DLB will not be zero.

Figure 5:
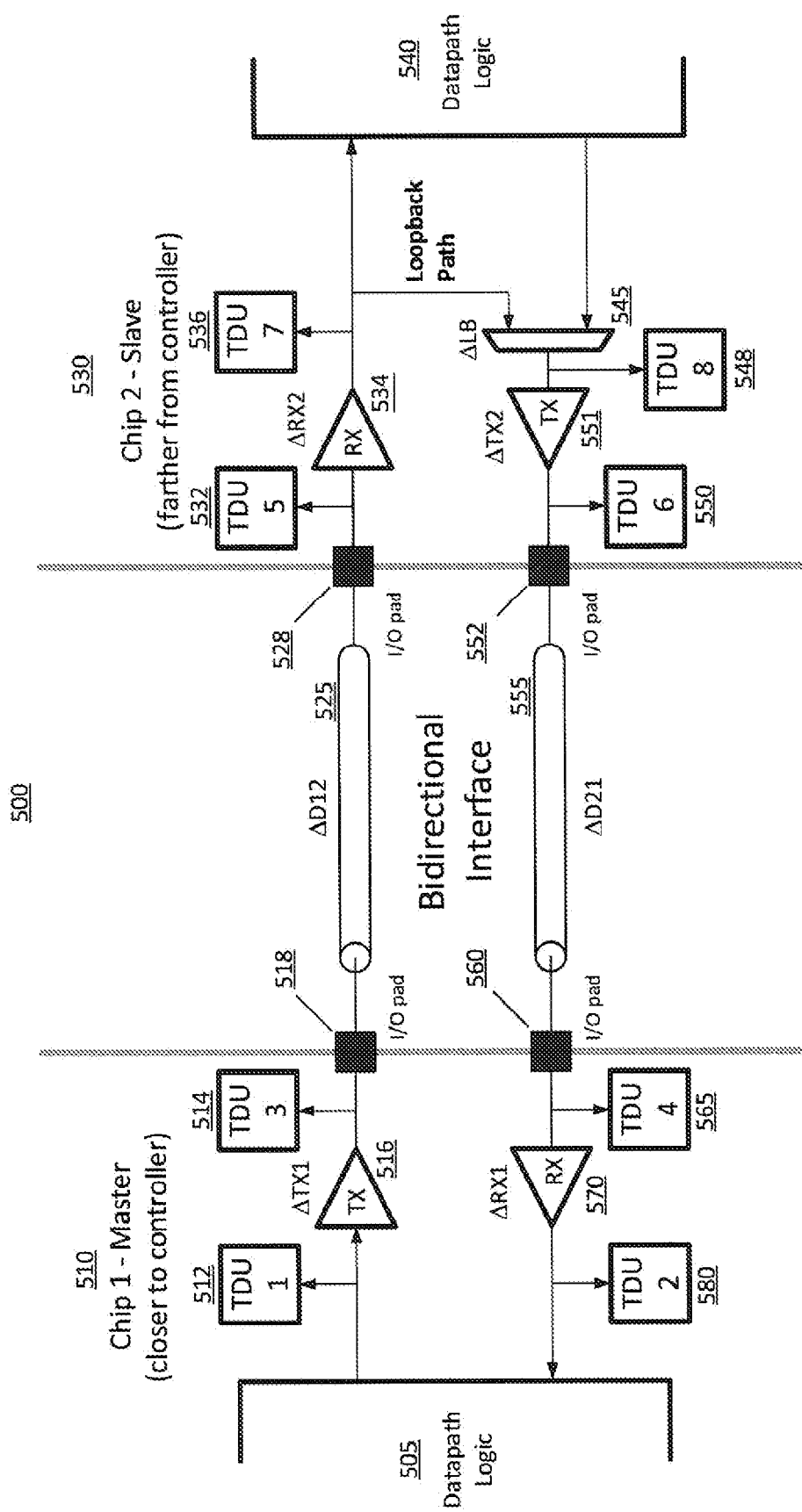
FIG. 5 illustrates embodiments for time synchronization across master and slave devices.

FIG. 5 depicts more precise measurements achieved from the round trip delay components. For this embodiment, the master IC (510) and slave IC (530) include datapath logic (505 and 540), TDUs (512, 514, 532, 536, 548, 550, 565, 580), and transceiver circuits (516, 570) and (534 and 551). With the use of multiple TDUs (512, 514, 532, 536, 548, 550, 565, 580), the delays of various circuits are directly measured. The delay measurements made entirely on one chip are compared to measurements on another chip because of the LSB of the time stamping circuits is the same over all the chips. However, absolute time readings cannot be combined between chips because the internal time is not synchronized between the two chips before the synchronization process is completed.

Using the on-chip TDUs (512, 514, 532, 536, 548, 550, 565, 580), DTX1, DRX1, DTX2, DRX2 and DLB can be measured. By passing data back and forth between the master IC (510) and the slave IC (530), the value of DD12+DD21 can be determined by the master IC (510). Assuming the two passive interconnect (525 and 555) delays are equal, then the master-to-slave latency $T_{latency}$ can be determined using equation (2). For a bidirectional interface (525 and 555) made from matched printed circuit board (PCB) traces, it is a good assumption that DD12 and DD21 are equal. If fiber optic cables are used for the bidirectional interface (525 and 555), then the delay asymmetry can be characterized over temperature and cable length and used to correct the value of DD12.

Note that synchronization between network elements, connected via electrical traces on a PCB, electrical cables or fiber optic cables, is disclosed herein. However, these embodiments may be extended to wireless connections between network elements, such as RF links and free-space optics.

Although the present invention has been described in terms of specific exemplary embodiments, it will be appreciated that various modifications and alterations might be made by those skilled in the art without departing from the spirit and scope of the invention.

What is claimed is:

1. A circuit, comprising:
a first integrated circuit ("IC") and a second IC;
a delay loop comprising at least one transmission path between the first IC and the second IC for propagating a signal through the transmission path, during an initialization, and for calculating a propagation delay time, $T_{latency}$, between the first IC and the second IC;
a synchronizing circuit on the second IC for recording a first time delay of an event relative to a second time delay of the event received at the first IC, comprising:
a phase-locked loop (PLL) circuit for generating a plurality of timing signals for the second IC using the PLL;
at least one time digitizer unit (TDU) for receiving a global offset, comprising global timing information and the $T_{latency}$, and for generating a timestamp to represent the first time delay at the second IC associated with the event relative to the second time delay of the event at the first IC, the TDU comprising:
a counter for generating most significant bits for a count;
a circuit for receiving the PLL timing signals and for generating least significant bit (LSB) for the count, wherein the resolution of the LSB of the count is based on gate delay of the PLL circuit; and
at least one adder for adding the global offset and the count to generate the timestamp for the event.

2. The circuit as set forth in claim 1, wherein a gate delay of the PLL comprises a least significant bit of less than or equal to 50 picoseconds for the timestamp.

3. The circuit as set forth in claim 2, wherein the PLL comprises a phase-frequency detector, a charge pump, loop filter, M-stage ring oscillator, phase interpolator and divider circuits for phase locking at least one of the timing signals to a system reference clock.

4. The circuit as set forth in claim 1, wherein the TDU further comprises:

a plurality of flip-flops and an encoder for receiving the timing signals from the PLL circuit and a strobe and for generating a plurality of bits of the timestamp.

5. The circuit as set forth in claim 4, wherein: the flip-flops and the encoder further for generating a n bit binary representation for the timestamps.

6. The circuit as set forth in claim 1, wherein the delay loop further comprises:
a first TDU and a transmitter, located on the first IC, a first transmission path between the first IC and a second IC, a loopback path in the second IC, a second transmission path between the second IC and the first IC, a receiver on the first IC and a second TDU on the first IC; and
datapath logic, located on the first IC, for propagating a signal in the delay loop and for calculating the propagation delay time, $T_{latency}$, from the timestamps of the first and second TDUs.

7. The circuit as set forth in claim 1, further comprising a plurality of the TDUs for generating a plurality of timestamps on the second IC.

8. A method for synchronizing two integrated circuits, comprising:
propagating a signal through a transmission path, during an initialization between the first IC and the second IC;
calculating a propagation delay time, $T_{latency}$, between the first IC and the second IC;
recording a first time delay of an event relative to a second time delay of the event received at the first IC, by:
generating a plurality of timing signals for the second IC using a phase-locked loop (PLL);
receiving a global offset, comprising global timing information and the $T_{latency}$;
generating a timestamp at the second IC, in at least one time digitizer unit (TDU), so as to generate the timestamp of the event at the second IC relative to the second time delay of the event at the first IC, by:
generating most significant bits for a count;
receiving the PLL timing signals and for generating a least significant bit (LSB) for the count, wherein the resolution of the LSB of the count is based on gate delay of the PLL circuit; and
adding the global offset and the count to generate the timestamp for the event.

9. The method as set forth in claim 8, wherein a gate delay of the PLL comprises a least significant bit of less than or equal to 50 picoseconds for the timestamp.

10. The method as set forth in claim 9, wherein generating a plurality of timing signals comprises phase locking at least one of the timing signals to a system reference clock in the PLL that comprises a phase-frequency detector, a charge pump, loop filter, M-stage ring oscillator, phase interpolator and divider circuits.

11. The method as set forth in claim 8, wherein the TDU further comprises:
a plurality of flip-flops and an encoder for receiving the timing signals from the PLL circuit and a strobe and for generating a plurality of bits of the timestamp.

12. The method as set forth in claim 11, further comprising generating a n bit binary representation for the timestamps.

13. The method as set forth in claim 8, wherein calculating a propagation delay time, $T_{latency}$, between a first IC and a second IC further comprises:
propagating a signal, from the first IC, through a first TDU and a transmitter, located on the first IC, a first transmission path between the first IC and a second IC, a loopback path in the second IC, a second transmission path between the second IC and the first IC, a receiver on the first IC and a second TDU on the first IC; and
calculating the propagation delay time, $T_{latency}$, from the timestamps of the first and second TDUs.

14. The method as set forth in claim 8, further comprising generating a plurality of timestamps on the second IC from a plurality of the TDU.

\* \* \* \* \*